US010813253B2

(12) United States Patent
Lunsman et al.

(10) Patent No.: US 10,813,253 B2
(45) Date of Patent: Oct. 20, 2020

(54) CHASSIS COOLING (71) Applicant: Hewlett Packard Enterprise Development LP, Houston, TX (US)

(72) Inventors: Harvey Lunsman, Chippewa Falls, WI (US); Steven Dean, Chippewa Falls, WI (US); Michael Scott, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 221 days.

(21) Appl. No.: 15/834,636

(22) Filed: Dec. 7, 2017

(65) Prior Publication Data
US 2019/0182988 A1 Jun. 13, 2019

(51) Int. Cl.
H05K 7/20 (2006.01)

(52) U.S. Cl.
CPC ..... *H05K 7/20781* (2013.01); *H05K 7/20254* (2013.01); *H05K 7/20272* (2013.01); *H05K 7/20281* (2013.01); *H05K 7/20772* (2013.01); *H05K 7/20836* (2013.01); *H05K 7/2079* (2013.01)

(58) Field of Classification Search
USPC ............................................ 165/104.33, 281
See application file for complete search history.

(56) References Cited

U.S. PATENT DOCUMENTS

| 4,865,123 | A | 9/1989 | Kawashima et al. |
| 7,149,084 | B2 | 12/2006 | Matsushima et al. |
| 7,420,804 | B2 | 9/2008 | Leija et al. |
| 8,430,156 | B2 | 4/2013 | Malone et al. |
| 9,291,408 | B2 * | 3/2016 | Iyengar ................... F28F 27/00 |
| 10,225,958 | B1 * | 3/2019 | Gao .................... H05K 7/20781 |
| 2005/0244280 | A1 * | 11/2005 | Malone ................. F04B 19/006 |
| | | | 417/286 |
| 2007/0209782 | A1 * | 9/2007 | Wyatt ................. F28D 15/0266 |
| | | | 165/76 |

(Continued)

FOREIGN PATENT DOCUMENTS

| CN | 1618263 A | 5/2005 |
| CN | 105472943 | 4/2016 |

(Continued)

OTHER PUBLICATIONS

European Search Report and Written Opinion received for EP Application No. 18203961.0, dated Apr. 12, 2019, 14 pages.

(Continued)

*Primary Examiner* — Joel M Attey
(74) *Attorney, Agent, or Firm* — Brooks, Cameron & Huebsch, PLLC (57) ABSTRACT Example implementations relate to a chassis cooling device. In some examples, a chassis cooling device may include a manifold within the chassis to distribute a cooling resource among a cooling loop and a heat exchanger; a first plurality of pumps, coupled to a cooling loop return portion of the manifold, arranged in parallel in the chassis to pump the cooling resource; and a second plurality of pumps, coupled to a cooling loop supply portion of the manifold, arranged in parallel in the chassis to pump the cooling resource, wherein the second plurality of pumps are arranged in series with the first plurality of pumps.

13 Claims, 6 Drawing Sheets

(56) References Cited

U.S. PATENT DOCUMENTS

2014/0069616 A1    3/2014  Wajima
2014/0231061 A1*   8/2014  Barringer ........... H05K 7/20736
                                                          165/279

FOREIGN PATENT DOCUMENTS

| EP | 0524757 A1 | 1/1993 |
| EP | 1448040 A2 | 8/2004 |
| EP | 1571532 A2 | 9/2005 |
| WO | 2004/112452 A1 | 12/2004 |
| WO | 2008/006362 A1 | 1/2008 |
| WO | 2013/100913 A1 | 7/2013 |
| WO | 2016/130152 A1 | 8/2016 |
| WO | WO-2016179169 A1 | 11/2016 |

OTHER PUBLICATIONS

Linus Tech Tips, "Building Custom Loop in Nzxt Phantom 820" by User mattias1172, Jul. 28, 2014, 7 pages.

* cited by examiner

CHASSIS COOLING

BACKGROUND

A chassis may include an enclosure that is utilized to house or physically assemble electronic computing components such as a chassis switch, servers, power supplies, etc. A plurality of chassis may be housed in a rack. The computing components may be configured to operate within a range of temperatures. The computing components may generate heat during their operation. Cooling systems may be utilized to dissipate the heat generated by the computing components and/or maintain a temperature of the computing components.

DETAILED DESCRIPTION

A cooling system may utilize an enclosed loop to deliver a cooling resource (e.g., conditioned liquid, water, distilled water, antifreeze, propylene glycol, ethylene glycol, coolant, etc.) to the computing components within a chassis and/or a rack. In an example, a cooling system may deliver the cooling resource to and/or through contact cooling components such as cold plates configured to transfer heat generated by the computing components to the cooling resource through contact. Additionally, the cooling system may deliver the cooling resource to and/or through a heat exchanger (e.g., a liquid heat exchanger, a rear door heat exchanger, etc.) configured to dissipate heat from the cooling resource through the heat exchanger.

The enclosed loop may include an extensive network of plumbing integrated and/or installed at an operating facility, such as at a data center or server farm. The large network of plumbing may connect to and/or between a plurality of racks. The large network of plumbing may circulate a relatively large volume of cooling resource, such as twenty or more gallons, during cooling. Accordingly, a leak in the large network of plumbing may result in a leak of the large volume of cooling resource. Computing components may be damaged or even disabled by exposure to liquids. A leak of twenty or more gallons in proximity with computing components housed in the chassis may lead to the damage and/or destruction of many expensive computing components.

In some examples, the cooling system may include a pump in fluid communication with the enclosed loop of the cooling system. The pump may circulate the cooling resource through the extensive network of plumbing utilizing a mechanical action. A size and power consumption of the pump may be correlated to the size of the plumbing network. As such, a cooling system including a large network of plumbing may utilizes a correspondingly large and relatively powerful pump that consumes a large amount of power.

Computing components may operate at distinct temperatures, have distinct cooling demands, and generate distinct quantities of heat in their operation. As described above, a cooling system may be utilized to cool an array of computing components housed in a variety of chassis and/or racks. In an example, a particular computing component may utilize relatively more cooling (e.g., more cooling resource, higher pressure of cooling resource, higher flow of cooling resource, etc.) in order to keep the particular computing component within a targeted operating temperature range.

In a cooling system including a large network of plumbing interconnecting a plurality of racks, the distribution of the cooling resource across the entire system may be adjusted in order to meet the demands of a particular computing resource being cooled by the system. For example, the speed of the pump that circulates the cooling resource through the entire large network of plumbing may be increased to meet the demands of a particular computing resource cooled by the network. As such, other computing components being cooled by the cooling system may receive extraneous cooling. As a result, the cooling system may be consuming additional power circulating a cooling resource throughout the entire cooling system at increased pressures and/or flow rates to cool a particular computing component of the plurality of computing components at an increased pressure and/or flow rate.

In contrast, examples of the present disclosure may include systems and devices for chassis cooling. For example, the systems and devices for chassis cooling may be integrated at the chassis level. The systems and device may utilize a first plurality of pumps and a second plurality of pumps in the chassis. The pumps may be coupled to a manifold in the chassis. The manifold may distribute a cooling resource among a cooling loop and a heat exchanger. The first plurality of pumps may be coupled to a cooling loop return portion of the manifold. The first plurality of pumps may be arranged in parallel in the chassis to pump the cooling resource. The second plurality of pumps may be coupled to a cooling loop supply portion of the manifold. The second plurality of pumps may be arranged in parallel in the chassis to pump the cooling resource. The second plurality of pumps may be arranged in series with the first plurality of pumps.

Figure 1:
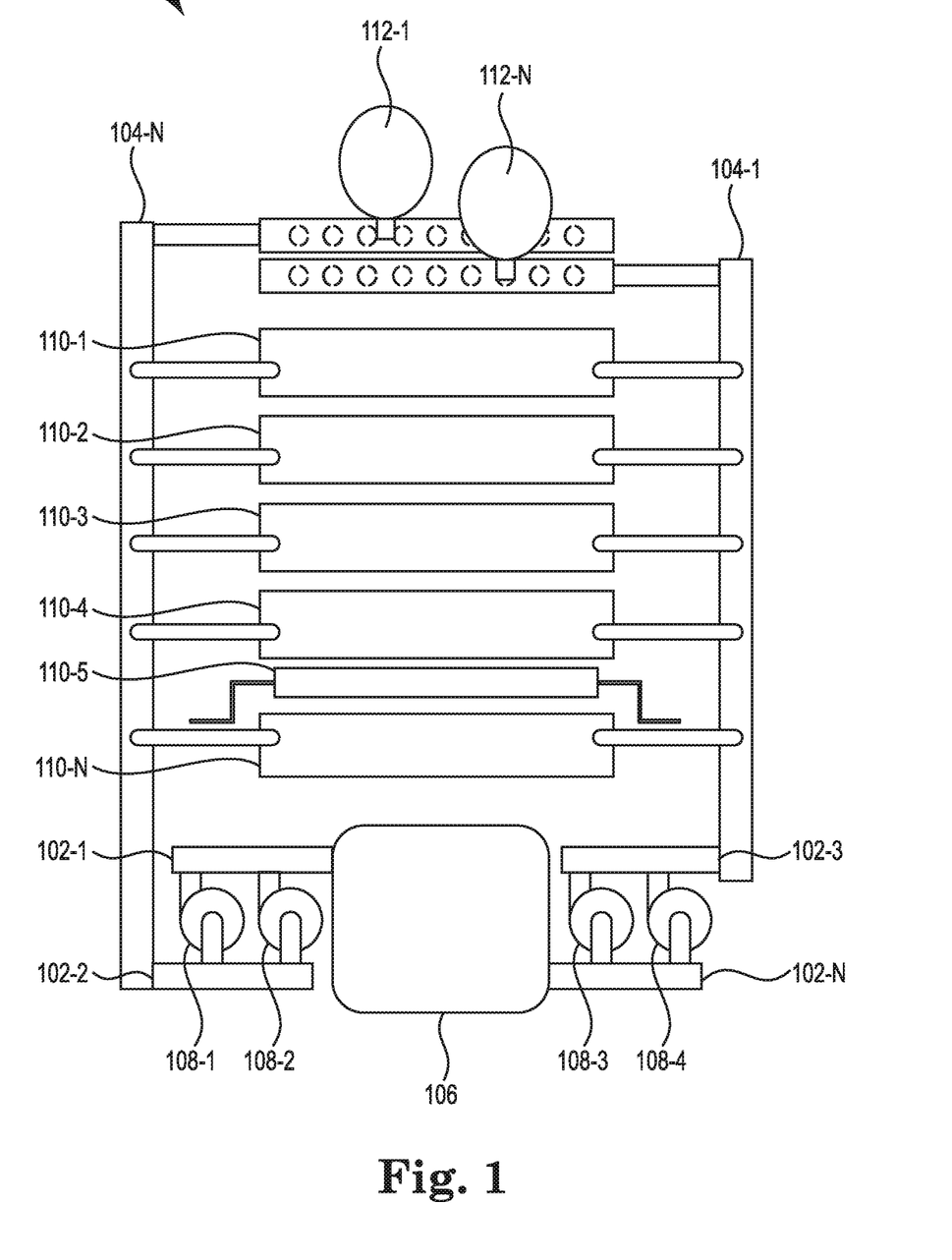
FIG. 1 illustrates a block diagram of an example of a portion of a chassis cooling device consistent with the present disclosure.

FIG. 1 illustrates a block diagram of a portion of a chassis cooling device 100 consistent with the present disclosure. The chassis cooling device 100 may be located within a chassis. For example, the chassis cooling device 100 may be integrated within a chassis containing computing components (e.g., a chassis switch, server blades, power supplies, chassis management controller, etc.). The chassis cooling device 100 may include a manifold 102-1 . . . 102-N. The manifold 102-1 . . . 102-N may serve as a cooling resource routing apparatus. For example, the manifold 102-1 . . . 102-N may include a plurality of channels, such as piping, to distribute the cooling resource. The manifold 102-1 . . . 102-N may distribute the cooling resource among a cooling loop 104-1 . . . 104-N and/or a heat exchanger 106 contained within a chassis. The distribution of the cooling resource may be determined by the portion of the manifold 102-1 . . . 102-N that the cooling resource enters. The manifold 102-1 . . . 102-N may include a plurality of portions.

Each of the portions of the manifold 102-1 . . . 102-N may include a self-aligning blind-mate quick-connect and/or quick-disconnect coupling configured to be coupled to a complementary self-aligning blind-mate quick-connect and/or quick-disconnect coupling of a pump 108-1 . . . 108-N. Each of the plurality of portions of the manifold 102-1 . . . 102-N may be coupled to a plurality of pumps 108-1 . . . 108-N. Each of the portions of the manifold 102-1 . . . 102-N may distribute a cooling resource to a distinct portion of the chassis cooling device 100.

For example, a first portion of the manifold, such as heat exchanger supply portion 102-1, may distribute a cooling resource from an outlet of a pump 108-1 and/or 108-2 to an inlet of a heat exchanger 106. A second portion of the manifold, such as cooling loop return portion 102-2, may distribute a cooling resource from cooling loop return portion 104-N of the cooling loop 104-1 . . . 104-N to an inlet of a pump 108-1 and/or 108-2. A third portion of the manifold, such as cooling loop supply portion 102-3, may distribute a cooling resource from an outlet of a pump 108-3 and/or 108-N into a cooling resource supply portion 104-1 of a cooling loop 104-1 . . . 104-N. A fourth portion of the manifold, such as heat exchanger return portion 102-N, may distribute a cooling resource from an outlet of a heat exchanger 106 to an inlet of a pump 108-3 and/or 108-N.

Although the above description of the manifold 102-1 . . . 102-N describes the coupling of four distinct pumps 108-1 . . . 108-N to the corresponding portions of the manifold 102-1 . . . 102-N, the present disclosure is not limited to such examples. Each of the portions of the manifold 102-1 . . . 102-N may be configured to be coupled to any amount of pumps 108-1 . . . 108-N and any amount of pumps 108-1 . . . 108-N may be utilized in the chassis cooling device 100.

The chassis cooling device 100 may include a cooling loop 104-1 . . . 104-N. The cooling loop 104-1 . . . 104-N may be the portion of the chassis cooling device 100 where heat is transferred from the computing components to the cooling resource. The cooling resource may flow through the cooling loop 104-1 . . . 104-N, absorbing heat generated by the computing components as it flows through.

The cooling loop 104-1 . . . 104-N may include a cooling loop supply portion 104-1 and a cooling loop return portion 104-N. The cooling loop supply portion 104-1 and the cooling loop return portion 104-N may be physically distinct portion of the cooling loop 104-1 . . . 104-N and/or may be identifiable by whether the cooling resource they carry has been utilized to cool the computing components since leaving the cooling loop supply portion 102-3 of the manifold 102-1 . . . 102-N, In some examples, the cooling loop supply portion 104-1 of the cooling loop 104-1 . . . 104-N may be a part of the cooling loop supply portion 102-3 of the manifold 102-1 . . . 102-N, In some examples, the cooling loop return portion 104-N of the cooling loop 104-1 . . . 104-N may be part of a cooling loop return portion 102-2 of a manifold 102-1 . . . 102-N.

The cooling loop supply portion 104-1 may distribute a cooling resource from the cooling loop supply portion 102-3 of the manifold 102-1 . . . 102-N. For example, the cooling loop supply portion 104-1 may distribute a cooling resource from the cooling loop supply portion 102-3 of the manifold 102-1 . . . 102-N to an inlet of a cold plate 110-1 . . . 110-N.

A cold plate 110-1 . . . 110-N may include a plate made of a material than may transfer heat between a computing component mounted on or in contact with the cold plate 110-1 . . . 110-N and a cooling resource pumped through a flow path, such as a channel or pipe, that is in contact with or runs through the cold plate 110-1 . . . 110-N. The cooling resource pumped through the flow path may absorb the heat generated and/or held by the computing components and carry the heat away resulting in a cooling of the cold plate 110-1 . . . 110-N and/or a cooling of the computing components. The cold plate 110-1 . . . 110-N may have a variety of structures having a flat plate form factor, a plurality of fins form factor, a radiator form factor, etc. The cold plate 110-1 . . . 110-N may be integrated into the design of the computing component.

The cooling loop supply portion 104-1 of the cooling loop 104-1 . . . 104-N may distribute a cooling resource to a plurality of cold plates 110-1 . . . 110N. The plurality of cold plates 110-1 . . . 110N may include different types of cold plates 110-1 . . . 110N and/or be utilized to cool different types of computing components. For example, a portion of the plurality of cold plates 110-1 . . . 110-N may be computing chassis switch blade cold plates, a portion of the plurality of cold plates 110-1 . . . 110-N may be power supply cold plates, and/or a portion of the plurality of cold plates 110-1 . . . 110-N may be chassis management controller cold plates.

The plurality of cold plates 110-1 . . . 110-N may utilize a distinct cooling resource parameters to cool its corresponding computing component. For example, the plurality of cold plates 110-1 . . . 110-N may utilize a distinct cooling resource pressure and/or a distinct cooling resource flow rate to cool its corresponding cooling component. The specific flow rate and/or pressure utilized by the cold plate 110-1 . . . 110-N may depend on the architecture of the cold plate 110-1 . . . 110-N and/or the performance characteristics of the computing components being cooled by a cold plate 110-1 . . . 110-N.

The cooling loop 104-1 . . . 104-N may include a pressure reservoir 112-1 . . . 112-N. The pressure reservoir 112-1 . . . 112-N may include a reservoir of pressurized cooling resource that, when connected to the chassis cooling device 100, maintains an amount of pressure and/or an amount of cooling resource within the cooling loop 104-1 . . . 104-N and/or other portions of the chassis cooling device 100. The pressure reservoir may be connected to the cooling loop supply portion 104-1 and/or the cooling loop return portion 104-N of the cooling loop 104-1 . . . 104-N.

The cooling loop return portion 104-N of the cooling loop 104-1 . . . 104-N may distribute a cooling resource from an outlet of a cold plate 110-1 . . . 110-N. For example, the cooling loop return portion 104-N of the cooling loop 104-1 . . . 104-N may distribute a cooling resource from a plurality of cold plates 110-1 . . . 110N to a cooling loop return portion 102-2 of a manifold 102-1 . . . 102-N.

The chassis cooling device 100 may include a heat exchanger 106. The heat exchanger 106 may include a structure to transfer heat between a cooling resource being returned from the cooling loop 104-1 . . . 104-N after absorbing heat from the compute components via the cold plates 110-1 . . . 110-N. The heat exchanger 106 may also include a second cooling resource flowing through a separate flow channel or pipe. The second cooling resource may include a facility's cooling resource. A facility's cooling resource may include a liquid, such as water, that is delivered from the facility's plumbing into and out of the heat exchanger 106. In an example, the heat exchanger 106 may include plumbing that routes facility water from facility plumbing, through a flow path separate from a flow path of the cooling resource within the chassis cooling device 100, and back out to facility plumbing. The heat from the cooling resource flowing through the cooling loop 104-1 . . . 104-N may be transferred, through the heat exchanger 106, to the facility's cooling resource and exhausted through facility drains while the cooling resource continues to flow through the heat exchanger 106 and back into the cooling loop 104.

The chassis cooling device may include a plurality of pumps 108-1 . . . 108-N. The plurality of pumps 108-1 . . . 108-N may be fluid pumps to pump a cooling resource through the cooling loop 104-1 . . . 104-N, the cold plates 110-1 . . . 110-N, the manifold 102-1 . . . 102-N, and/or the heat exchanger 106. The plurality of pumps 108-1 . . . 108-N may be integrated with a chassis during operation of the chassis cooling device 100. For example, the plurality of pumps 108-1 . . . 108-N may be entirely within the chassis during operation of the chassis cooling device 100.

Portions of the plurality of pumps 108-1 . . . 108-N may be arranged in parallel. For example, pumps 108-1 and 108-2 may be arranged in parallel with respect to one another. The inlet and/or the outlet of pumps 108-1 and 108-2 may be at identical points relative to the fluid system. Likewise, pumps 108-3 and 108-N may be arranged in parallel.

When two or more of the plurality of pumps 108-1 . . . 108-N are arranged in parallel, the resulting performance curve of the fluid system may be obtained by adding the flow rates of the respective pumps that are arranged in parallel. Utilizing pumps in parallel may allow for redundancy in the event that one of the pumps fails, Additionally, utilizing pumps in parallel may allow for scaling the flow rate of the cooling resource through the cooling loop 104-1 . . . 104-N, through the cold plates 110-1 . . . 110-N, and/or through the heat exchanger 106, For example, the flow rate may be adjusted by selectively operating one or more of the pumps arranged in parallel and/or by selectively altering the speed of one or more of the pumps arranged in parallel to produce different flow rates.

Portions of the plurality of pumps 108-1 . . . 108-N may be arranged in series. For example, pumps 108-1 and 108-2 may be arranged in series with pumps 108-3 and 108-N. For example, the cooling resource discharged from pumps 108-1 and 108-2 is influenced by the suction of pumps 108-3 and 108-N and vice versa. When two or more of the plurality of pumps 108-1 . . . 108-N are arranged in series the resultant pressure head, or internal energy of the cooling resource due to the pressure exerted on its container, is the sum or the individual pressure heads of the pumps 108-1 . . . 108-N that are placed in series. Utilizing pumps 108-1 . . . 108-N in series allows for distributing and scaling pressure across the cooling loop 104-1 . . . 104-N, across the cold plates 110-1 . . . 110-N, and/or across the heat exchanger 106.

A first plurality of pumps 108-1 and 108-2, arranged in parallel, may be coupled to a cooling loop return portion 102-2 of the manifold 102-1 . . . 102-N at their inlet and coupled to a heat exchanger supply portion 102-1 of the manifold 102-1 . . . 102-N at their outlet. The first plurality of pumps 108-1 and 108-2 may pull the cooling resource from the return portion 104-N of the cooling loop 104-1 . . . 104-N within the chassis. The first plurality of pumps 108-1 and 108-2 may discharge the cooling resource through an inlet of the heat exchanger 106.

A second plurality of pumps 108-3 and 108-N, arranged in parallel with one another and in series with the first plurality of pumps 108-1 and 108-2, may be coupled to a heat exchanger return portion 102-N of the manifold 102-1 . . . 102-N at their inlet and coupled to the cooling loop supply portion 102-3 of the manifold 102-1 . . . 102-N at their outlet. The second plurality of pumps 108-3 and 108-N may pull the cooling resource from the heat exchanger 106 and discharge the cooling resource into the supply portion 104-1 of the cooling loop 104 within the chassis.

As described above, the arrangement of the plurality of pumps 108-1 . . . 108-N in parallel and in series allows for the scaling and/or distribution of flow rate and/or pressure across the chassis cooling device 100. As described above, the heat exchanger 106, the cold plates 110-1 . . . 110-N, and/or the computing components cooled by the cold plates 110-1 . . . 110-N may have varied cooling demands that may fluctuate over time. The arrangement of the plurality of pumps 108-1 . . . 108-N in parallel and in series staggered across the inlets and the outlets of the heat exchanger 106 and the inlet and the outlet of the cooling loop 104-1 . . . 104-N may allow for a specific calibration of the flow rate and the pressure. In this manner the flow rate and the pressure of the cooling resource may be tailored to the cold plates 110-1 . . . 110-N and/or tailored to the heat exchanger 106 individually and/or together. In the event that the heat exchanger 106 or a cold plate 110-1 . . . 110-N is switched out with a different type of heat exchanger 106 or cold plate 110-1 . . . 110-N the pressure and the flow rate may be adjusted accordingly by adjusting the operation of the pumps 108-1 . . . 108-N. Furthermore, in the event that a specific computing task is being performed by the computing components that increasing cooling demands, the flow rate and the pressure may be adjusted to accommodate increased or decreased cooling demands.

Additionally, the above described parallel and serially arranged pumps 108-1 . . . 108-N in the system may allow for the chassis cooling device 100 to be utilized within the chassis without relying on external plumping, cooling resource sources, large pumps, large amounts of cooling resource, etc. Instead, the chassis cooling device 100 may utilize less than a gallon of cooling resource in the chassis cooling device 100. Since each chassis in a plurality of chassis in a rack and a plurality of racks in a data center may utilize the chassis cooling device 100, the risk of a leak at a single chassis cooling device 100 may be a gallon of liquid. That is, in contrast to interconnected systems involving large plumbing networks that could generate a twenty gallon or more leak of cooling liquid from a leak in a single chassis, the chassis cooling device 100 may present a far smaller leak risk to computing components. Additionally, less electricity may be utilized by the pumps 108-1 . . . 108-N to circulate the cooling resource than would be utilized by a large pump servicing a plurality of chassis.

Moreover, the pressure and/or flow rate of the chassis cooling device 100 may be precisely configured to the cooling parameters of the particular chassis and/or the particular computing components being cooled in the chassis. The pressure and/or flow rate of a particular chassis may be configured without altering the pressure and/or flow rate of other chassis cooling devices integrated into other chassis. Likewise, the pressure and/or flow rate of the chassis cooling device 100 may be precisely adjusted to address changing cooling parameters of the particular chassis and/or the particular computing components being cooled in the chassis without altering the pressure and/or flow rate of other chassis cooling devices integrated into other chassis.

The plurality of pumps 108-1 . . . 108-N may be individually hot-swappable. For example, each of the plurality of pumps 108-1 . . . 108-N may include self-aligning blind-mate quick-connect and/or quick-disconnect coupling that allows the body of the pump 108-1 . . . 108-N and the fluid system of the chassis cooling device 100 to stay sealed until a connection is established between the two opening them to one another. As such, the chassis cooling device 100 and/or any functional pumps 108-1 . . . 108-N may continue to operate, pumping a cooling resource through the chassis cooling device 100, while a non-functional pump is removed and/or while an additional pump is introduced. Because the plurality of pumps 108-1 . . . 108-N are hot swappable the cooling loop 104-1 . . . 104-N and/or the heat exchanger 106 may continue to operate without bleeding the cooling resource in order to swap out pumps.

The plurality of pumps 108-1 . . . 108-N may have adjustable operating speeds. As such, the speed of the plurality of pumps 108-1 . . . 108-N may be adjusted to adjust the pressure and flow rate of the cooling resource circulating through the chassis cooling device 100. For example, a speed of the first plurality of pumps 108-1 . . . 108-2 may be adjusted to modify a flow rate of the cooling resource through the cooling loop 104-1 . . . 104-N and the speed of the second plurality of pumps 108-3 . . . 108-N may be adjustable to modify the pressure in the cooling loop 104-1 . . . 104-N.

The chassis cooling device 100 may include a pressure sensor (not illustrated). The pressure sensor may measure the pressure of the cooling resource at various points in the chassis cooling device 100. For example, the pressure sensor may be utilized to determine a change in pressure of the cooling resource from a cooling loop supply portion 104-1 of the cooling loop 104-1 . . . 104-N to a cooling loop return portion 104-N of the cooling loop 104-1 . . . 104-N in the chassis. The measured pressure may be utilized to adjust the operation of the plurality of pumps 108-1 . . . 108-N to reach a targeted pressure and/or flow rate. The measured pressure may be utilized to determine whether a pump 108-1 . . . 108-N is malfunctioning. The measured pressure may be utilized to determine an adjustment to a pump 108-1 . . . 108-N. The measured pressure may be utilized to detect a leak in the chassis cooling device 100. The measured pressure may be utilized to determine a level of a cooling resource in the chassis cooling device 100. The measured pressure may be utilized to determine a pressure at each of the cold plates 110-1 . . . 110-N and/or at the heat exchanger 106.

The chassis cooling device 100 may include a temperature sensor (not illustrated). The temperature sensor may be utilized to determine the temperature of the cooling resource, the cold plates 110-1 . . . 110-N, the computing components being cooled by the cold plates 110-1 . . . 110-N, the temperature of the chassis environment, etc. The measured temperature may be utilized to determine how much heat energy the chassis cooling device 100 is removing from the computing components.

Figure 2:
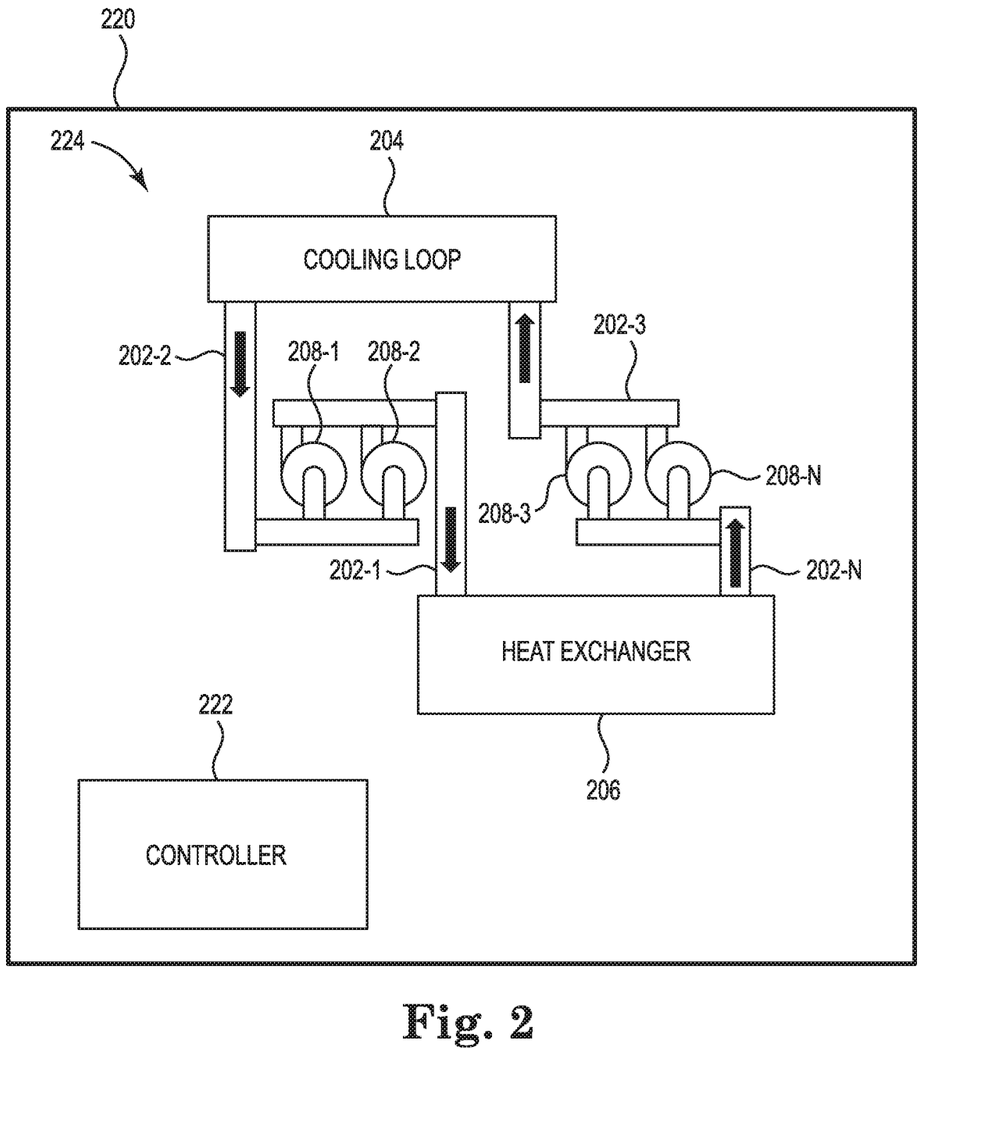
FIG. 2 illustrates a block diagram of an example of a system consistent with the present disclosure.

FIG. 2 illustrates a block diagram of a system 220 consistent with the present disclosure. The system 220 may include a chassis cooling system 224. The chassis cooling system 224 may include the chassis cooling device 100 described in relation to FIG. 1, the chassis cooling device 400 described in relation to FIGS. 4A and 4B, and/or the chassis cooling device 500 described in relation to FIG. 5. The direction of a flow of a cooling resource through the chassis cooling system 224 is illustrated by the direction indicating arrows.

The chassis cooling system 224 may be integrated within a chassis. The chassis cooling system 224 may include a first plurality of pumps 208-3 and 208-N. The first plurality of pumps 208-3 and 208-N may be arranged in parallel relative to one another in the chassis cooling system 224. The first plurality of pumps 208-3 and 208-N may be located within the chassis. The first plurality of pumps 208-3 and 208-N may pump a cooling resource. The first plurality of pumps 208-3 and 208-N may pump the cooling resource from a heat exchanger 206 to a cold plate located in the cooling loop 204 within the chassis.

The chassis cooling system 224 may include a second plurality of pumps 208-1 and 208-2. The second plurality of pumps 208-1 and 208-2 may also be located within the chassis. The second plurality of pumps 208-1 and 208-2 may be arranged in parallel relative to one another in the chassis cooling system 224. The second plurality of pumps 208-1 and 208-2 may be arranged in series with the first plurality of pumps 208-3 and 208-N and vice versa. The second plurality of pumps 208-1 and 208-2 may pump the cooling resource from the cold plate located in the cooling loop 204 to the heat exchanger 206.

The chassis cooling system 224 may include a manifold 202-1 . . . 202-N that provides a connection point to a fluid routing path between the cooling loop 204, the heat exchanger 206, and the plurality of pumps 208-1 . . . 208-N. The manifold 202-1 . . . 202-N may include a cooling loop return portion 202-2 that connects the cooling loop 204 to the inlet of the second plurality of pumps 208-1 and 208-2. The manifold 202-1 . . . 202-N may include a heat exchanger supply portion 202-1 that connects the outlet of the second plurality of pumps 208-1 and 208-2 to the inlet of the heat exchanger 206. The manifold 202-1 . . . 202-N may include a heat exchanger return portion 202-N that connects the outlet of the heat exchanger to an inlet of the first plurality of pumps 202-3 and 202-N. The manifold 202-1 . . . 202-N may include a cooling loop supply portion 202-3 that connects the outlet of the first plurality of pumps 202-3 and 202-N to the cooling loop 204.

The system 220 may include a controller 222. The controller may include a processing resource to execute machine-readable instructions stored on a machine-readable media to cause the processing resource to perform actions and/or functions associated with operating the chassis cooling system 224.

In other examples, the controller 222 may include logic. As used herein, "logic" may be an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in a memory and executable by a processor. It is presumed that logic similarly executes instructions for purposes of the examples of the present disclosure.

In some examples, the controller 222 may include a combination of logic and machine-readable instructions stored on a machine-readable media to cause a processing resource to perform actions and/or functions associated with operating the chassis cooling system 224.

The controller 222 may detect an operating characteristic within the chassis cooling system 224. For example, the controller 222 may detect a pressure and/or a pressure drop occurring within the chassis cooling system. The controller 222 may detect a temperature and/or temperature difference of a cooling resource within the chassis cooling system 224. The controller 222 may detect a temperature and/or a temperature difference of a facility's cooling resource being circulated through the heat exchanger 206. The controller 222 may detect an operating temperature, speed, or other condition of each of the plurality of pumps 208-1 . . . 208-N. The controller 222 may detect a process being performed by a computing resource being cooled at the cold plate. The controller 222 may detect a temperature of a computing resource being cooled at the cold plate. The controller 222 may detect a temperature and/or dew point within a chassis and/or within a facility housing a chassis.

The controller 222 may detect the operating characteristic from a plurality of sensors in the chassis cooling system 224. For example, the controller may detect the operating characteristic from pressure sensors, temperature sensors, and/or flow meters located throughout the chassis cooling system 224. Alternatively, the controller 222 may detect the operating characteristic from a signal received from a computing component cooled by the cold plate. For example, a computing component may transmit a signal to the controller 222 when it reaches a threshold temperature associated with overheating. Additionally, the controller 222 may detect the operating characteristic from an ambient temperature sensor and/or a humidity sensor that may be remotely located relative to the chassis housing the chassis cooling system 224.

The controller 222 may adjust an operation of the chassis cooling system 224 based on the operating characteristic. For example, the controller 222 may adjust an operation of the chassis cooling system 224 by adjusting a speed of the first plurality of pumps 208-3 and 208-N. Adjusting the speed of the first plurality of pumps 208-3 and 208-N may adjust a flow rate of the cooling resource through the cold plate and/or a pressure of the cooling resource. The controller 222 may adjust an operation of the chassis cooling system 224 by adjusting a speed of the second plurality of pumps 208-1 and 208-2 to adjust a flow rate of the cooling resource through the cold plate and/or a pressure of the cooling resource. For example, increasing the operating speed of the first plurality of pumps 208-3 and 208-N, arranged in parallel, may increase the flow rate of the cooling resource through the cooling loop 204. Meanwhile, decreasing the speed of the second plurality of pumps 208-1 and 208-2, arranged in serial with the first plurality of pumps 203-3 and 203-N, may increase the pressure of the cooling resource in the cooling loop 204.

The controller 222 may adjust an operation of the chassis cooling system 224 by switching between operating modes. For example, the controller 222 may switch to a performance mode by adjusting the first plurality of pumps 203-3 and 203-N and the second plurality of pumps 203-1 and 203-2 to operate at full speed with all valves in the chassis cooling system 224 fully opened, and the chassis cooling system 224 delivering a highest amount of cooling. The controller 222 may switch to a facilities return temperature set point mode adjusting the operating speeds of the first plurality of pumps 203-3 and 203-N and the second plurality of pumps 203-1 and 203-2 to maintain a target temperature of the facilities cooling resource that is exhausted from the heat exchanger 206.

The controller 222 may switch to a preservation mode by adjusting the first plurality of pumps 203-3 and 203-N and the second plurality of pumps 203-1 and 203-2 to run at a slowest speed that still provides a targeted amount of cooling to a computing component. The controller 222 may switch to an idle mode by reducing the operating speed of and/or switching off the first plurality of pumps 203-3 and 203-N and the second plurality of pumps 203-1 and 203-2 when a computing component being cooled through the cooling loop 204 is in an idle state such as a low power mode, a standby mode, an off mode, and/or an idle mode. The controller 222 may switch to a secondary temperature delta mode by periodically adjusting the operating speed of the first plurality of pumps 203-3 and 203-N and the second plurality of pumps 203-1 and 203-2 to maintain a specific temperature delta of the temperature of the cooling resource from the inlet of a cold plate to an outlet of a cold plate in the cooling loop 204.

The controller 222 may switch to a facility cooling resource temperature delta mode by adjusting the operating speed of the first plurality of pumps 203-3 and 203-N and the second plurality of pumps 203-1 and 203-2 to maintain a specific temperature delta of the temperature of a facility cooling resource from the facility cooling resource inlet of the heat exchanger 206 to the facility cooling resource outlet of the heat exchanger 206. The controller 222 may switch to a condensation prevention mode by temporarily increasing the cooling resource temperature by adjusting the speed of the first plurality of pumps 203-3 and 203-N and the second plurality of pumps 203-1 and 203-2 when the cooling resource temperature is within a threshold temperature of a dew point in order to prevent condensation.

Figure 3:
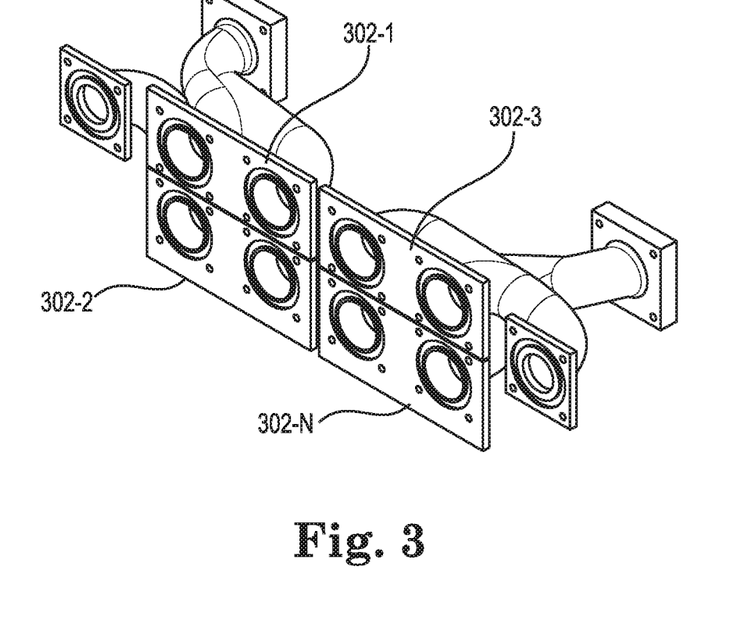
FIG. 3 illustrates a perspective view of an example of a manifold of a chassis cooling device consistent with the present disclosure.

FIG. 3 illustrates a manifold 302-1 . . . 302-N of a chassis cooling device consistent with the present disclosure. The manifold 302-1 . . . 302-N may be utilized in the chassis cooling device 100 described in relation to FIG. 1, the chassis cooling system 224 described in relation to FIG. 2, the chassis cooling device 400 described in relation to FIGS. 4A and 4B, and/or the chassis cooling device 500 described in relation to FIG. 5

The manifold 302-1 . . . 302-N may include a plurality of portions. For example, the manifold 302-1 . . . 302-N may include a cooling loop return portion 302-2 that connects the cooling loop to the inlet of a plurality of pumps arranged in parallel. The manifold 302-1 . . . 302-N may include a heat exchanger supply portion 302-1 that connects the outlet of the plurality of pumps to the inlet of the heat exchanger. The manifold 302-1 . . . 302-N may include a heat exchanger return portion 302-N that connects the outlet of the heat exchanger to an inlet of a plurality of pumps arranged in parallel. The manifold 302-1 . . . 302-N may include a cooling loop supply portion 302-3 that connects the outlet of the plurality of pumps to the cooling loop.

Figure 4A:
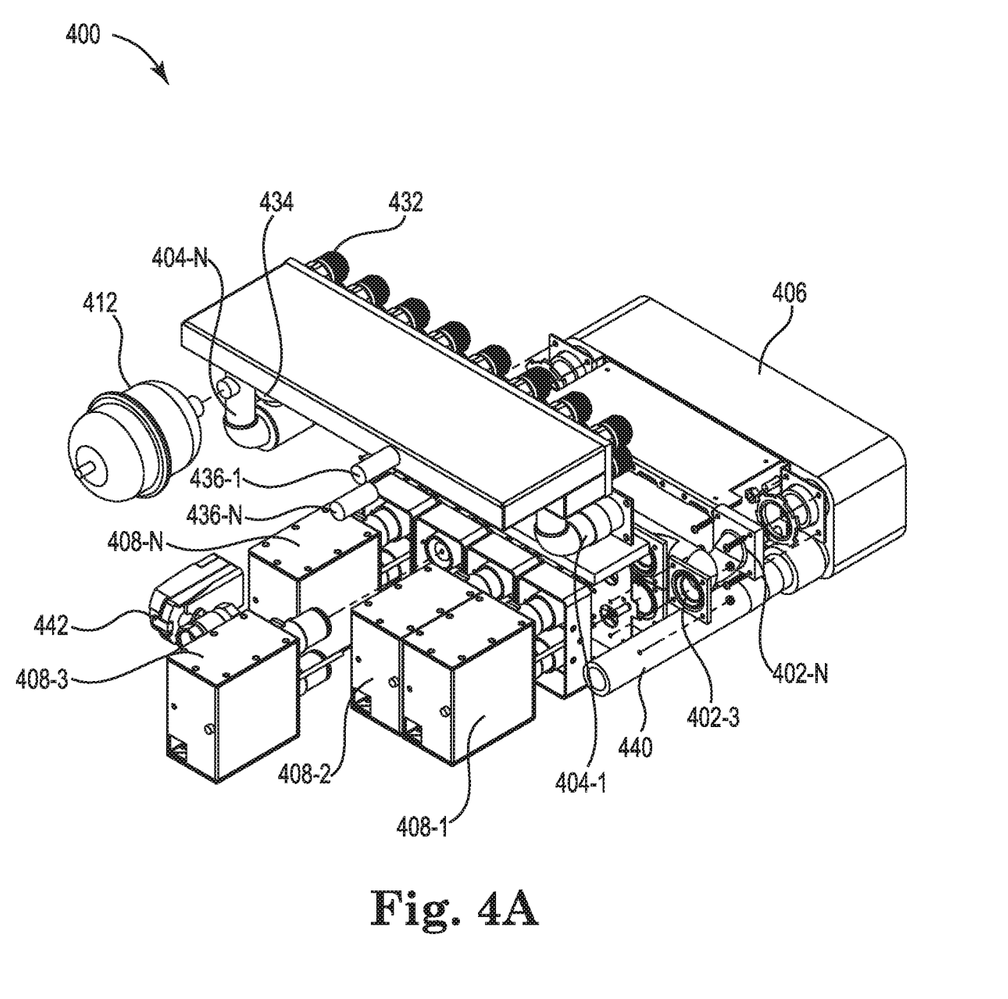
FIG. 4A illustrates an exploded perspective view of an example of a portion of a chassis cooling device.
Figure 4B:
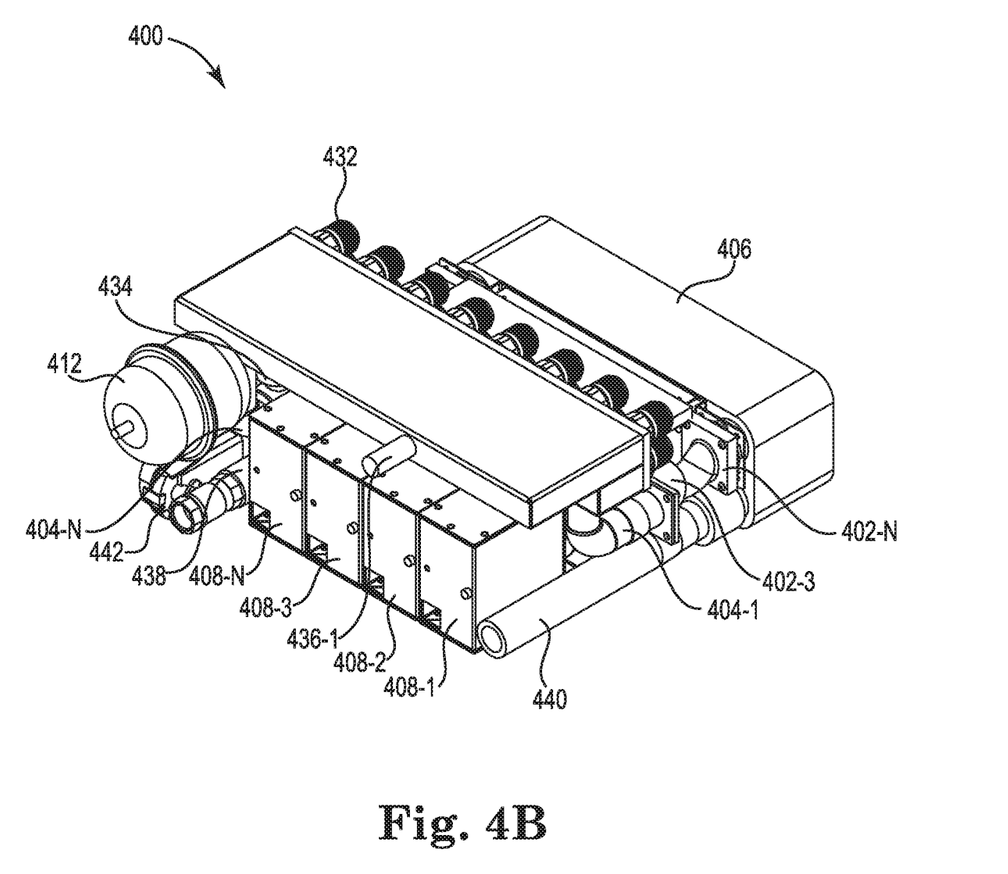
FIG. 4B illustrates an assembled perspective view of an example of a portion of the chassis cooling device.

FIG. 4A illustrates an exploded perspective view of a portion of a chassis cooling device 400. FIG. 4B illustrates an assembled perspective view of the portion of the chassis cooling device 400. The chassis cooling device 400 may include the chassis cooling device 100 described in relation to FIG. 1, the chassis cooling system 224 described in relation to FIG. 2, and/or the chassis cooling device 500 described in relation to FIG. 5

The chassis cooling device 400 may be integrated within a chassis housing computing components. The chassis cooling device 400 may include a first pump 408-1. The first pump 408-1 may be located within the chassis. The first pump 408-1 may pull a cooling resource into the pump 408-1 from an outlet of a heat exchanger 406 through a heat exchanger return portion 402-N of a manifold. The first pump 408-1 may discharge the cooling resource through a cooling loop supply portion 402-3 of a manifold to a cold plate coupled to a cooling loop 404-1 . . . 404-N.

The chassis cooling device 400 may include a second pump 408-2. The second pump 408-2 may also be located within the chassis. The second pump 408-2 may be arranged in parallel with the first pump. The second pump 408-2 may also pull a cooling resource into the pump 408-2 from an outlet of a heat exchanger 406 through a heat exchanger return portion 402-N of a manifold. The second pump 408-2 may also discharge the cooling resource through a cooling loop supply portion 402-3 of a manifold to a cold plate coupled to a cooling loop 404-1 . . . 404-N.

The chassis cooling device 400 may include a third pump 408-3. The third pump 408-3 may also be located within the chassis. The third pump 408-3 may be arranged in series with the first pump 408-1 and/or the second pump 408-2.

The third pump 408-3 may pull the cooling resource into the pump 408-3 from the cold plate coupled to a cooling loop 404-1 . . . 404-N through a cooling loop return portion of the manifold. The third pump 408-3 may discharge the cooling resource through the heat exchanger supply portion of the manifold to the inlet of the heat exchanger 406.

The chassis cooling device 400 may include a fourth pump 408-N. The fourth pump 408-N may also be located in the chassis. The fourth pump 408-N may be arranged in parallel with the third pump 408-3. The fourth pump 408-N may be arranged in series with the first pump 408-1 and/or the second pump 408-2. The fourth pump 408-N may pull the cooling resource into the pump 408-N from the cold plate coupled to a cooling loop 404-1 . . . 404-N through a cooling loop return portion of the manifold. The fourth pump 408-N may also discharge the cooling resource through the heat exchanger supply portion of the manifold to the inlet of the heat exchanger 406. Although the example of the chassis cooling device 400 is described with respect to four pumps 408-1 . . . 408-N, the chassis cooling device 400 may include and/or utilize any amount of pumps located within the chassis. The described configurations are expandable to accommodate any amount of pumps within the chassis.

Each of the first pump 408-1, the second pump 408-2, the third pump 408-3, and the fourth pump 408-N may be individually mate-able and removable to the manifold that is directing the cooling resource between the cold plates connected to the cooling loop 404-1 . . . 404-N and the heat exchanger 406. The pumps 408-1 . . . 408-N may include self-aligning blind-mate quick-connect and/or quick-disconnect couplings to engage with the manifold. The pumps 408-1 . . . 408-N may be hot-swappable during the operation of the chassis cooling device 400. The pumps 408-1 . . . 408-N may be variable speed pumps that may be individually adjusted without interrupting the circulation of the cooling resource through the chassis cooling device 400. Therefore, operational pumps may continue to pump the cooling resource while a failed pump is removed and replaced with a fifth pump.

The chassis cooling device may include a plurality of self-aligning blind-mate quick-connect and/or quick-disconnect couplings 432 for hot-swappable cold plates and/or computing components on the cooling loop 404-1 . . . 404-N, The self-aligning blind-mate quick-connect and/or quick-disconnect couplings 432 may allow the cooling resource to be pumped through the cold plates and/or computing components and back into the cooling loop 404-1 . . . 404-N. Because the self-aligning blind-mate quick-connect and/or quick-disconnect couplings 432 may be self-sealing, cold plates and/or computing components may be connected and/or disconnected from the chassis cooling device 400 without interrupting the circulation of the cooling resource through the chassis cooling device 400. The self-aligning blind-mate quick-connect and/or quick-disconnect couplings 432 may be arranged in vertically aligned pairs that mate to an inlet of a cold plate and/or computing component and to an outlet of the cold plate and/or computing component, respectively.

The chassis cooling device 400 may include a pressure reservoir 412. The pressure reservoir 412 may include an expansion tank or reservoir tank for holding a cooling resource at a target pressure. The pressure reservoir 412 may come pre-charged with the cooling resource at the target pressure and may be attached to a return portion of the cooling loop 404-N to add cooling resource to the chassis cooling device 400 and maintain a target pressure. The pressure reservoir may also utilize self-aligning blind-mate quick-connect and/or quick-disconnect coupling to couple to the chassis cooling device 400.

Additionally, an automatic bleed valve (ABV) or air release valve (ARV) 434 may be attached to the return portion of the cooling loop 404-N. The ABV and/or ARV 434 may include a valve that is utilized to release trapped air from the cooling resource and/or the flow path of the cooling resource throughout the chassis cooling device 400. The ABV and/or ARV 434 may release the trapped air without releasing the cooling resource from the chassis cooling device 400.

The chassis cooling device 400 may include a plurality of sensors 436-1 . . . 436-N. The plurality of sensors 436-1 . . . 436-N may be located on the cooling loop 404-1 . . . 404-N. The plurality of sensors 436-1 . . . 436-N may include a temperature sensor, a flow meter, and/or a pressure sensor. The plurality of sensors 436-1 . . . 436-N may measure the temperature, flow rate, and/or pressure of the cooling resource at a supply portion of the cooling loop 404-1 and/or at a return portion of the cooling loop 404-N. In an example, the plurality of sensors 436-1 . . . 436-N may include a pressure sensor located on the at a supply portion of the cooling loop 404-1 and a pressure sensor located at a return portion of the cooling loop 404-N that may be utilized to detect a pressure loss in the chassis cooling device 400. In such examples, the plurality of sensors 436-1 . . . 436-N may be utilized to detect a leak in the chassis cooling device 400 and/or a pump failure based on a sensed loss in pressure.

The chassis cooling device 400 may include the heat exchanger 406. The heat exchanger 406 may be a liquid-to-liquid heat exchanger. The heat exchanger 406 may transfer heat from a cooling resource circulated through the cooling loop 404-1 . . . 404-N to a facility's cooling resource circulating through a separate flow path in the heat exchanger 406. For example, the heat exchanger 406 may include a facility's cooling resource inlet 440 and a facility's cooling resource outlet 438. The facility's cooling resource may be pumped into the facility's cooling resource inlet 440, through the heat exchanger 406 to absorb heat from the cooling resource circulated through the cooling loop 404-1 . . . 404-N. The facility's cooling resource may then be discharged out of the facility's cooling resource outlet 438 to be exhausted from the facility and/or conditioned for recirculation through the facility.

The chassis cooling device 400 may include a facility's cooling resource modulating valve 442, The modulating valve 442 may be coupled to the facility's cooling resource outlet 438 of the heat exchanger 406. The chassis cooling device 400 may modulate the flow rate of the facility's cooling resource by adjusting the modulating valve 442 to modulate the amount of facility's cooling resource passing out of the facility's cooling resource outlet 438. Adjusting the modulating valve 442 may adjust the amount and/or rate of heat that is absorbed by the facility's cooling resource from the cooling resource circulated through the cooling loop 404-1 . . . 404-N.

Figure 5:
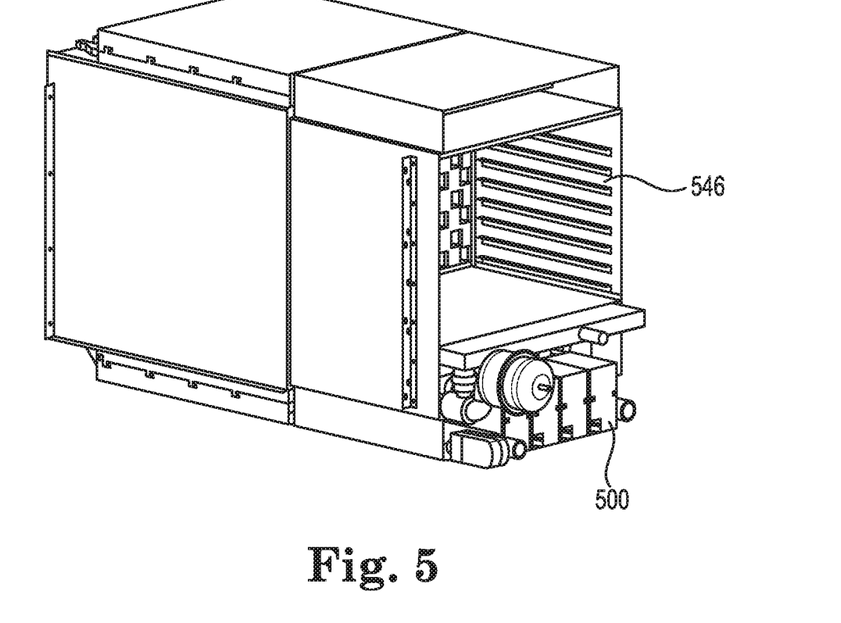
FIG. 5 illustrates a perspective view of an example of a portion of a chassis cooling device within a chassis.

FIG. 5 illustrates a perspective view of a portion of a chassis cooling device 500 within a chassis 546. The chassis cooling device 500 may include the chassis cooling device 100 described in relation to FIG. 1, The chassis cooling system 224 described in relation to FIG. 2, and/or the chassis cooling device 400 described in relation to FIGS. 4A and 4B.

The chassis 546 may include an enclosure that is utilized to house or physically assemble electronic computing components such as chassis switches, servers, power supplies, etc. For example, the chassis 546 may include an enclosure that may support sixty-four central processing unit sockets.

The chassis cooling device 500 may be integrated within the chassis 546. The chassis 546 may be populated with computing components. The chassis cooling device 500 may be utilized to dissipate the heat generated by the operation of the computing components populating the chassis 546. The chassis cooling device 500 may pump a cooling resource through a cooling loop and a heat exchanger within the chassis 546. The cooling resource may absorb the heat generated by the computing components while it is pumped through a cold plate in contact with the computing components. The heat absorbed in the cooling resource may then be transferred, at the heat exchanger, to a facility's cooling resource pumped through the heat exchanger from outside of the chassis. Once the facility's cooling resource has absorbed the heat from the cooling resource within the chassis, the facility's cooling resource may be exhausted back out of the chassis.

The chassis cooling device 500 may be arranged in the chassis 546 such that the pumps of the chassis cooling device are accessible from a front opening of the chassis 546. The pumps, along with the cold plates, may be connected and/or disconnected with the chassis cooling device 500 via self-aligning blind-mate quick-connect and/or quick-disconnect couplings that allow for hot-swapping during continued operation of the chassis cooling device 500.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. A "plurality of" is intended to refer to more than one of such things.

The figures herein follow a numbering convention in which the first digit corresponds to the drawing figure number and the remaining digits identify an element or component in the drawing. For example, reference numeral 102 may refer to element "02" in FIG. 1. Further, reference numeral 202 may refer to element "02" in FIG. 2. In such examples, the element of 102 and 202 may be functionally and/or structurally identical. Elements shown in the various figures herein can be added, exchanged, and/or eliminated so as to provide additional examples of the disclosure. In addition, the proportion and the relative scale of the elements provided in the figures are intended to illustrate the examples of the disclosure and should not be taken in a limiting sense. Further, as used herein, "a" refers to a single instance of an element for which there may be multiple instances of that element, and "a plurality of" an element and/or feature can refer to more than one instances of such elements and/or features.

What is claimed:

1. A system comprising:
   a chassis containing compute resources that generate heat;
   a chassis cooling system including:
   a manifold having a plurality of portions including at least one supply portion and at least one return portion of a cooling loop to cool the compute resources;
   a first plurality of pumps external to the manifold, arranged in parallel with respect to each other, and located within the chassis, the first plurality of pumps to pump a cooling resource from a heat exchanger to a cold plate within the chassis, the cold plate attached to the cooling loop and to remove at least a portion of the generated heat; and
   a second plurality of pumps arranged in parallel with respect to each other and located within the chassis to pump the cooling resource within the cooling loop from the cold plate to the heat exchanger, wherein the second plurality of pumps is in series with the first plurality of pumps,
   wherein each of the first plurality of pumps and the second plurality of pumps is individually mate-able and removeable, via a complementary coupling of the each pump, to the manifold; and
   a controller to:
   detect an operating characteristic within the chassis cooling system; and
   adjust an operation of the chassis cooling system based on the operating characteristic, at least in part, by providing a command indicating that a specific computing task is being performed by the compute resources, the command to alter a specific calibration of flow and pressure to accommodate increased or decreased cooling demands for the cooling loop.

2. The system of claim 1, further comprising the controller to detect the operating characteristic from a signal received from a computing component of the compute resources cooled by the cold plate.

3. The system of claim 1, further comprising the controller to adjust the operation of the chassis cooling system by adjusting a speed of the first plurality of pumps to adjust the specific calibration of flow of the cooling resource through the cold plate.

4. The system of claim 1, further comprising the controller to adjust the operation of the chassis cooling system by adjusting a speed of the second plurality of pumps to adjust the pressure of the cooling resource.

5. A server chassis cooling device, comprising:
   a first pump located within a chassis to pump a cooling resource from a heat exchanger to a cold plate within the chassis, the cold plate associated with a cooling loop providing circulation of the cooling resource through the cooling loop;
   a second pump, arranged in parallel with the first pump, located within the chassis to pump, via the cooling loop, the cooling resource from the heat exchanger to the cold plate within the chassis;
   a third pump located within the chassis to pump, via the cooling loop, the cooling resource from the cold plate to the heat exchanger, wherein the third pump is located in series with the first pump;
   a fourth pump, arranged in parallel with the third pump, located within the chassis to pump, via the cooling loop, the cooling resource from the cold plate to the heat exchanger, wherein the fourth pump is arranged in series with the second pump, and
   a controller to:
   detect an operating characteristic of a cold plate associated with the chassis cooling device; and
   adjust an operation of the chassis cooling device based on the operating characteristic of the cold plate, at least in part, by providing a command indicating that a specific computing task is being performed by the server and associated with the cold plate, the command to alter a specific calibration of flow and pressure to accommodate increased or decreased cooling demands for the cooling loop.

6. The server chassis cooling device of claim 5, wherein the first pump, the second pump, the third pump, and the fourth pump are individually mate-able and removable via a complementary coupling for each respective pump to a manifold directing the cooling resource between the cold plate and the heat exchanger.

7. The server chassis cooling device of claim 6, further comprising a sensor to detect a failed pump of the first pump, the second pump, the third pump, or the fourth pump, wherein an operational pump of the first pump, the second pump, the third pump, and the fourth pump continues to pump the cooling resource while the failed pump is removed from the manifold and a fifth pump is mated to the manifold.

8. The server chassis cooling device of claim 5, further comprising a pressure sensor to detect a leak in the chassis cooling device based on a sensed pressure loss within the cooling loop.

9. The server chassis cooling device of claim 6, wherein the first pump, the second pump, the third pump, and the fourth pump are external to the manifold.

10. The server chassis cooling device of claim 5, wherein an arrangement of the first pump, the second pump, the third pump, and the fourth pump, with respect to each other, allows for a specific calibration of flow and pressure across the cooling loop, in part, by adjusting operation characteristics of a selected pump individually.

11. The server chassis cooling device of claim 6, wherein the manifold includes a plurality of portions including at least one supply portion and at least one return portion, and distribution of the cooling resource is determined by a first supply portion, of the plurality of portions, of the manifold that the cooling resource enters, to distribute the cooling resource to a distinct portion of the server chassis cooling device.

12. The system of claim 1, wherein distribution of the cooling resource is determined by a first supply portion, of the plurality of portions, of the manifold that the cooling resource enters, to distribute the cooling resource to a distinct portion of the chassis cooling system.

13. The system of claim 12, wherein responsive to the command indicating that the specific computing task is being performed, increasing the flow rate into the first supply portion.

* * * * *